(12) United States Patent
Honda

(10) Patent No.: US 7,638,020 B2
(45) Date of Patent: Dec. 29, 2009

(54) VERTICAL MAGNETIC RECORDING MEDIUM AND MANUFACTURING METHOD THEREOF

(75) Inventor: Yoshinori Honda, Kanagawa-ken (JP)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 615 days.

(21) Appl. No.: 11/259,675

(22) Filed: Oct. 25, 2005

(65) Prior Publication Data

US 2006/0093868 A1 May 4, 2006

(30) Foreign Application Priority Data

Oct. 28, 2004 (JP) ............................. 2004-313369

(51) Int. Cl.
*C23C 14/34* (2006.01)
(52) U.S. Cl. .................................. 204/192.2
(58) Field of Classification Search ............... 204/192.2
See application file for complete search history.

(56) References Cited

U.S. PATENT DOCUMENTS

| | | | | |
|---|---|---|---|---|
| 6,544,893 B2 * | 4/2003 | Eto | ............................ | 438/693 |
| 2004/0202843 A1 * | 10/2004 | Moriwaki et al. | ......... | 428/195.1 |
| 2005/0255336 A1 * | 11/2005 | Mukai | ......................... | 428/831 |

FOREIGN PATENT DOCUMENTS

| | | |
|---|---|---|
| JP | 05-114103 | 5/1993 |
| JP | 2002-342908 | 11/2001 |

* cited by examiner

*Primary Examiner*—Rodney G McDonald
(74) *Attorney, Agent, or Firm*—Townsend and Townsend and Crew LLP; Darren Gold

(57) ABSTRACT

A magnetic recording medium of higher coercive force and a manufacturing method thereof are provided by enabling reactive sputtering of stable reproducibility even with the addition of oxygen in the formation of a magnetic film using oxygen addition type reactive sputtering. In one embodiment, a vertical magnetic recording medium having SiC and $SiO_x$ (x=1 to 2) is provided. Further, a method of manufacturing a vertical magnetic recording medium including the addition of an Ar gas and an oxygen gas to an SiC-containing target in the step of forming a film of a magnetic layer on a soft magnetic under layer by reactive sputtering is provided.

12 Claims, 5 Drawing Sheets

VERTICAL MAGNETIC RECORDING MEDIUM AND MANUFACTURING METHOD THEREOF

CROSS-REFERENCES TO RELATED APPLICATIONS

This application claims priority from Japanese Patent Application No. JP2004-313369, filed Oct. 28, 2004, the entire disclosure of which is incorporated herein by reference.

BACKGROUND OF THE INVENTION

The present invention relates to information recording and reproducing. More particularly, the present invention relates to a magnetic recording medium in magnetic recording, and it proposes a method of manufacturing a vertical magnetic recording medium, specifically, a method of manufacturing a granular medium. Further, the present invention relates to a constitution of the granular medium manufacturing method and the manufacturing method thereof.

Existent magnetic recording media of an in-plane recording system involves a problem of thermal stability and improvement of the thermal stability characteristics has also been demanded. The thermal stability is a phenomenon in which signals recorded to a magnetic recording medium are decayed after the lapse of a predetermined time and, finally, the recording signals are lowered to a medium noise level and recorded signals cannot be read out. This is a result of progress for the refinement of magnetic particles due to higher S/N ratio coping with increasing recording density in recent years.

In order to solve the problems described above, a vertical magnetic recording system has been studied instead of the in-plane recording. The vertical magnetic recording system has attracted attention as a system capable of maintaining a good thermal stability in a high recording density region and also capable of attaining a sufficient S/N ratio. A general vertical magnetic recording medium comprises a vertical magnetic recording layer including a vertically magnetized film for recording information signals, a soft magnetic under layer for enhancing the recording-reproducing efficiency of signals, and plural non-magnetic layers having various functions such as improvement of the crystallinity and control for the crystal grain size of the vertical recording layer.

In the film-forming technique for a vertical magnetic recording medium, particularly, a magnetic film, various studies have been made so far. In recent years, with the demand for the improvement of the recording density, vigorous improvement for the coercive force (Hc) has been made continuously in magnetic recording media, particularly, magnetic disks for use in HDD.

For the magnetic film composition used in the sputtering of magnetic films in order to develop the vertical magnetic anisotropy, some have proceeded to add B, Si, Ta, Ti, Zr, Al, W and oxides thereof as a fourth additive element to CoCrPt series media. Among them, the method of adding the oxides has been most frequently adopted in forming a granular magnetic film. For example, Patent Document 1 (JP-A No. 2002-342908) discloses using a target in which $Cr_2O_3$, $TiO_2$, $ZrO_2$ or $Y_2O_3$ is used in admixture together with a magnetic film containing an Si oxide mainly comprising CoCrPt on a substrate made of a resin. Further improvement of the magnetic characteristic provided by the addition of $SiO_2$ and addition of $O_2$ upon sputtering in addition to Ar is well-known.

BRIEF SUMMARY OF THE INVENTION

However, in the prior art, since the sputtering methods described above involve reactive sputtering, the stability and reproducibility for the reaction cause a problem. For example, the reaction occurring upon sputtering by adding $SiO_2$ into a CoCrPt magnetic film and by using an Ar gas and an oxygen gas has the content shown below. In $CoCrPtSiO_2+Ar+O_2$ system, it proceeds as: $SiO_2+Ar \rightarrow SiO+O$, $SiO+O_2 \rightarrow SiO_2+O$, which is a non-equilibrium reaction with always excessive oxygen. The excess oxygen oxidizes Co or Cr to produce $CoO_x$ or $CrO_x$, resulting in deterioration of the characteristics.

Since the phenomenon is caused even if any of the oxides or single elements described above is used, it is extremely difficult to constitute a stable and reproducible process. Further, in the method of manufacturing a vertical magnetic recording medium, since the sputtering has to be conducted at room temperature, the substrate cannot be cooled making it difficult to improve the characteristics of the magnetic film. The reason why the film formation at a room temperature is necessary is to form segregation at the grain boundary of a Co core by using an oxide such as $SiO_2$. Further, this is because $SiO_2$, Si, etc. intrude in the Co core at high temperature, failing to develop the vertical magnetic anisotropy. As described above, since sputtering of an oxide such as $SiO_2$ inevitably causes reactive sputtering and further $O_2$ is added for promoting the reaction, it is extremely difficult to constitute a stable and reproducible process.

Further, in the case of $SiO_2$ addition, upon sputtering of $SiO_2$ in the target, $Ar^+$ is charged at the surface of $SiO_2$ by the negative potential applied to the target to provide a positive potential. When the state is kept, the $SiO_2$ surface has a state exceeding the potential applied to the target and as a result abnormal discharge called arching frequently occurs in which particles scattered by abnormal discharge are deposited to the substrate.

In view of the above, in the invention, with an aim of constituting the reactive sputtering as a more stable and reproducible process, a process attaching an importance to the stability and reproducibility considering mass productivity and magnetic film addition elements irrespective of the sputtering system such as DC, RF, DC-Pulse, etc. are provided.

The invention provides a vertical magnetic recording medium having SiC and $SiO_x$ (x=1 to 2). Further, it provides a method of manufacturing a vertical magnetic recording medium in which an Ar gas and an oxygen gas are added to an SiC-containing target in the step of forming a film of a magnetic layer by reactive sputtering on a soft magnetic under layer. As described above, stability can be ensured by adopting carbides series additives not known so far.

According to the invention, it is possible for film formation with stability and reproducibility, without degrading the characteristics due to excess oxygen. Further, since any of the sputtering systems such as AC, DC, RF, DC-Pulse, etc. can be adopted by using electroconductive SiC, selection range for facilities is extended greatly, which can extend the margin of the process and improve the productivity.

DETAILED DESCRIPTION OF THE INVENTION

Specific embodiments of a magnetic recording medium and a manufacturing method thereof according to the invention are to be described specifically with reference to the drawings.

Figure 1:
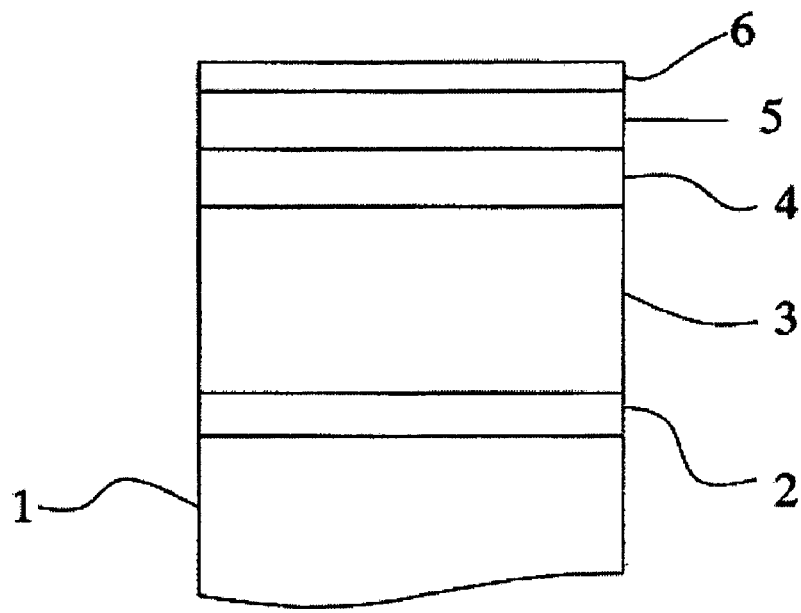
FIG. 1 shows a cross sectional view of a magnetic recording medium used in the invention.

A magnetic recording medium according to an embodiment of the invention is a metal thin film type magnetic recording medium in which a magnetic thin film comprising CoCrPt (a ferromagnetic material) as a main ingredient is formed on a substrate. FIG. 1 shows a cross sectional view of a magnetic recording medium used in the invention. As shown in FIG. 1, a magnetic recording medium comprises a substrate 1, an adhesion layer 2 formed on the substrate 1, a soft magnetic under layer 3 formed on the adhesion layer, an underlayer 4 formed on the soft magnetic under layer 3, a magnetic layer 5 formed on an underlayer 4, and a protective layer 6 formed on the magnetic layer 5.

The magnetic layer 5 mainly includes CoCrPt and contains SiC, Si-oxide ($SiO_x$: x=1-2) comprising as a main ingredient CoCrPt obtained by reactive sputtering of a target containing electroconductive SiC as a carbide of Si by addition of $O_2$ to an Ar gas.

As described above, by the use of the electroconductive SiC, it is possible to attain easiness of sputtering and obtain a high quality medium without causing abnormal discharge by eliminating the potential difference caused by the difference of elements on the target surface. That is, by the addition of the electroconductive SiC in addition to Co, Cr, and Pt as the main constituent elements of the magnetic film, the electroconductivity is ensured for the target per se. Even if a gas mixture formed by adding an oxygen gas to an Ar gas upon sputtering is used, SiC, SiO and $SiO_2$ promote segregation in addition to Co, Cr, and Pt in the step of forming the magnetic film, thereby enabling to optionally develop magnetic characteristics. The reaction during sputtering in the invention is as shown below.

DC sputtering is enabled by the use of the electroconductive SiC and since the reaction:

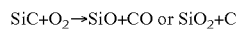

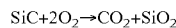

takes place, reaction with excess oxygen is suppressed and produced CO and $CO_2$ are exhausted as gases by a vacuum pump, it is possible to develop the vertical magnetic anisotropy with no oxidation of main elements constituting the magnetic film such as Co, Cr, etc.

Further, when the electroconductive SiC different from $SiO_2$ is used, electrostatic charges are not generated since this is electroconductive and sputtering is conducted in the same manner as metal. Therefore, occurrence of particles due to arching or the like can be decreased greatly compared with the existent cases to provide an advantage that the quality of the medium can be maintained easily.

The compositional ratio of a CoCrPt target containing the electroconductive SiC is such an amount that the electroconductive SiC is in the range of about 5 mol % to 40 mol % based on CoCrPt and the thickness of the magnetic layer 5 is in the range of about 5 nm to 20 nm. Further, the coercive force of the formed magnetic layer 5 is 4 kOe or more and less than 8 kOe.

Further, to set the coercive force of the recording layer, preferably, to the range of 5.5 kOe to 7.0 kOe so that the performance of the magnetic head is unleashed, it is desirable that the film formation is conducted with the content of the SiC in the target of 5 mol % to 20 mol % and the thickness of the magnetic layer within a range of from about 7 nm to 17 nm. Further, it is preferred to conduct film formation with the amount of oxygen added to Ar upon formation of the magnetic film being in the range of about 0.25% to 3%.

While any of a number of materials can be used for the substrate 1 shown in FIG. 1, glass substrate, ceramic substrate, Al/Ni/P plated substrate, etc. are preferred in view of the heat resistance, flatness and smoothness. Further, the surface roughness of the substrate 1 depends on the flying height of a magnetic head and, particularly, the center line mean roughness Ra is about 0.3 nm or less and the maximum protrusion height is about 5 nm or less. The roughness can be obtained by a simultaneous both face grinding using diamond abrasive grains. In this case, so-called texturing flaws may be present in the circumferential direction as substrate fabrication flaws. In the examples to be described later, the results obtained by using the glass substrate are shown below but the substrate is not always restricted to glass.

As the material for the adhesion layer 2 shown in FIG. 1, it may suffice that the material can ensure stresses in plural layers stacked in the upper layer and ensure adhesion with the upper layer, and any of Ni series alloys, Co series alloys, Al series alloys, etc. can be used. For example, they include, Ni40Ta, Ni30Te10Zr, Ni30Al, Ni30Cr, Co20Ti, Co50Ti, Co20Ta and Al50Ta. In the film formation, usual DC sputtering is possible and selection of the layer according to the purpose is possible irrespective of amorphousness or crystallization.

Referring to the soft magnetic under layer 3 on the adhesion layer 2 shown in FIG. 1, it may suffice that the magnetic layer 3 has a saturation magnetic flux density (hereinafter referred to as Bs) for returning magnetic fluxes from a short axis magnetic head to the return magnetic pole of the head with no magnetic resistance and those with the value Bs of about 0.8 T to 3.0 T can be selected. Referring to the film thickness, the entire thickness of the soft magnetic under layer 3 other than the single layer is in the range of about 50 nm to 300 nm. As a constitution of the structure, a so-called magnetic domain control pinned-APC (pinned anti-parallel coupling) having a magnetic domain pinned layer, an APC not having magnetic domain pinned layer, and an unbalanced APC can be used in addition to the single layer. It may suffice that the materials for the soft non-magnetic layer 3 have high Bs and they can include, for example, CoTaZr, CoNbZr, CoTaNbCoFeB, NiFe, FeTaC, FeTaB, FeTaCuC, FeTaCu, etc. Further, to constitute the APC structure, it is possible to incorporate a non-magnetic layer such as Ru, Cu, C, RuCo between the stacked layers.

As the material for the underlayer 4 shown in FIG. 1, it can be selected, for example, from NiFe, Ta, W, WCr, Ru, RuCo, Cu, Ti, CoTi, AlTi, etc. for controlling the crystal grain size and the crystal orientation of the magnetic layer 5 and it can be constituted with multi-layers formed by combination or stacking of them. While the film thickness is different depending on the purpose, it is preferable to be in the range of about 5 nm to 20 nm with an aim of improvement for the crystal orientation and magnetic recording characteristics since excess distance between the magnetic head and the soft magnetic under layer 3 gives an effect on the RW characteristics.

As the protective layer 6 shown in FIG. 1, a carbon film is generally applicable but a so-called DLC (diamond like carbon) by a CVD method or an IBD method is applicable. For DLC and carbon films, nitrogen or hydrogen is added preferably in order to maintain the bonding force of a lubricant when it is coated. A fluoro type liquid lubricant can be used as the lubricant.

Now, a method of manufacturing a magnetic recording medium shown in FIG. 1 is to be described.

Figure 2:
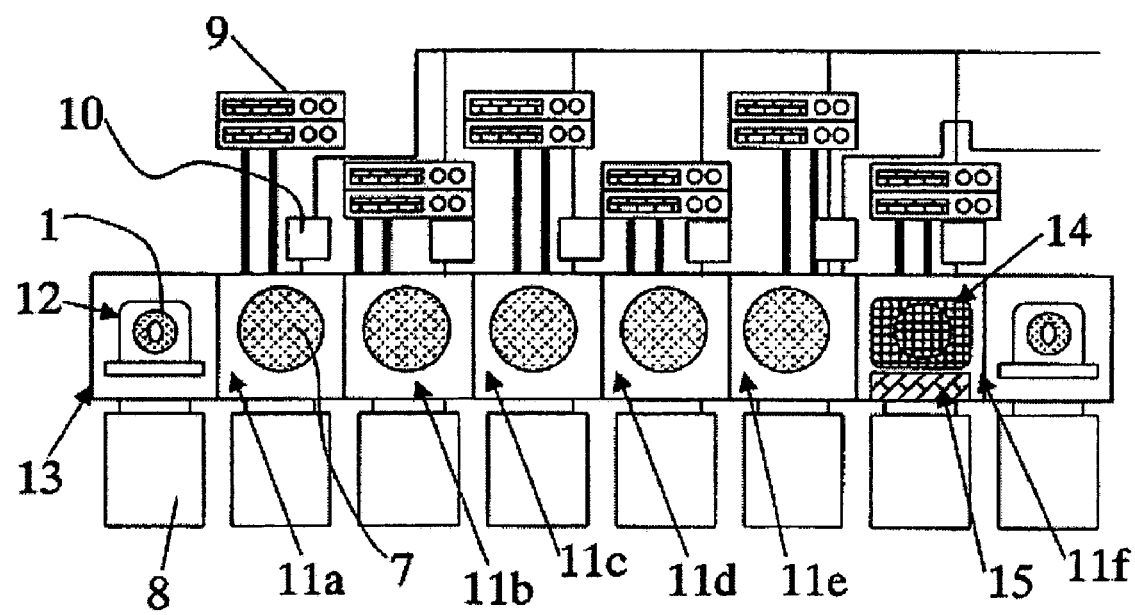
FIG. 2 is schematic view for a continuous multi-layer sputtering apparatus used in the manufacture of the magnetic recording medium according to an embodiment of the invention.

By using a substrate which is previously applied with surface roughness fabrication, cleaning and drying, film formation is conducted by sputtering successively using a so-called continuous multi-layer sputtering apparatus shown in FIG. 2.

The multi-layer sputtering apparatus shown in FIG. 2 comprises a cathode 7 for sputtering each of the layers, a vacuum exhaustion pump 8, a sputter power supply 9, and a gas flow rate control mechanism 10 used for sputtering. Further, the multi-layer sputtering apparatus comprises a process chamber 11 (chambers 11a to 11e) for keeping the entire portion to an optional vacuum degree and a holder 12 for holding and conveying the substrate 1. With this apparatus, the substrate is loaded from a substrate load chamber 13 and film formation is conducted successively. Each of the processing chambers 11a to 11e is previously exhausted by each of the vacuum exhaust pumps 8 such that the vacuum degree is $3 \times 10^{-5}$ Pa or less. In each of the processes, sputtering is conducted while keeping a desired pressure by the gas flow rage control mechanism 10. In the following examples, since an RF-CVD method is adopted instead of the sputtering method upon film formation of the protective film 6, it has a structure having a substrate bias mechanism 15 in addition to the RF electrode 14.

Further, as the sputtering system, a DC magnetron system having a particularly high efficiency is adopted in the sputtering and not only the sputtering for usual metal or alloy but also reactive sputtering, RF sputtering or the like can also be adopted.

At first, a fabricated and cleaned substrate 1 is held and mounted to the substrate holder 12 in the load chamber 13, and then transported to chamber 11a exhausted to high vacuum. Then, after flowing an Ar gas by the gas flow rate control mechanism 10 and keeping the chamber at a predetermined pressure, power is supplied from the sputtering power source 9 to a target (material for adhesion layer) held in contact with the cathode 7. The sputtering gas (Ar) is ionized to thereby generate plasmas and the target is sputtered to form the adhesion layer 2 on the substrate 1. The pressure kept at this process is in the range of 0.1 Pa to 2 Pa.

The film formation method described above is conducted also in other film formation processes successively in the same manner in processing chambers 11a to 11e except for film formation for the protective layer 6 by the CVD method. However, since the film formation for the magnetic layer 5 is conducted by reactive sputtering, an oxygen gas is added in addition to the Ar gas, and the process is conducted under a pressure kept at 1.5 Pa to 5 Pa and a bias voltage is also applied sometimes for higher performance.

For the film formation of the protective layer 6, an RF-CVD method is applied. In a state where hydrogen and nitrogen are added each in a predetermined amount to an ethylene gas as the starting material gas for conducting CVD, an RF power is applied to the RF electrode 14 and a bias voltage is applied to the substrate 1 by the substrate bias mechanism 15 to form a protective layer 6 referred to as DLC to the uppermost surface of the substrate. The pressure is maintained at 2 Pa to 3 Pa, 5% to 30% of hydrogen and 1% to 3% of a nitrogen gas are added to an ethylene gas. The film formation time, an RF application power and a substrate bias voltage are controlled such that the film thickness of the protective layer 6 is in the range of about 3 nm to 5 nm.

After taking out the magnetic recording medium thus deposited from the vacuum apparatus and coating a fluoric lubricant by a dipping method, the surface of the medium is frictionally rubbed by a varnishing head with an aim of removing abnormal protrusions and dusts on the surface and applying a treatment for ensuring a certain flying property of the magnetic head to complete a magnetic recording medium.

Examples of the present invention are to be described specifically.

EXAMPLE 1

Film formation was conducted for the adhesion layer 2 to the underlayer 4 by the following procedures as an example of the invention, and the magnetic characteristics thereof were evaluated by using the film formation conditions for the magnetic layer 5 as the parameter.

At first, a glass substrate after cleaning of φ65 mm×0.635 mmt, with the surface roughness Ra: 0.320 nm was used for the substrate 1. The glass substrate was placed in the continuous multi-layer sputtering apparatus, an Ni40Ta target was used as the adhesion layer 2, and DC-power of 500 W was charged by a DC magnetron cathode under the condition at an Ar pressure of 1.25 Pa to form a layer of 30 nm thickness.

Then, after forming a film of Co10Ta5Zr to 100 nm as the soft magnetic under layer 3, an Ru film was formed to 1 nm and, further, a Co10Ta5Zr film was formed to 100 nm to form an APC structure. The Ar pressure during film formation was made constant at 0.5 Pa in each case. The charged power by the DC magnetron cathode was 2 kw for CoTaZr and 100 w for Ru.

The under layer 4 had a two layer structure of Ta and Ru, the film thickness was made constant to 3 nm for Ta and to 15 nm for Ru, and the Ar pressure upon film formation was set at 1 Pa for Ta and 4 Pa for Ru.

A DC magnetron cathode was used upon film formation of the magnetic layer 5, the film formation pressure was set to 4.2 Pa and the film formation time was changed and controlled at a constant DC charged power of 500 W such that the film thickness was set constant to 15 nm. The target used was a 50 to 95 mol % (67 at % Co15 at % Cr18 at % Pt)+5 to 50 mol % SiC target. The charged power was controlled to be constant at 500 W and the film formation time was controlled based on the film formation speed so as to provide a 15 nm film thickness respectively. The gas used for sputtering consisted of Ar.

Figure 7:
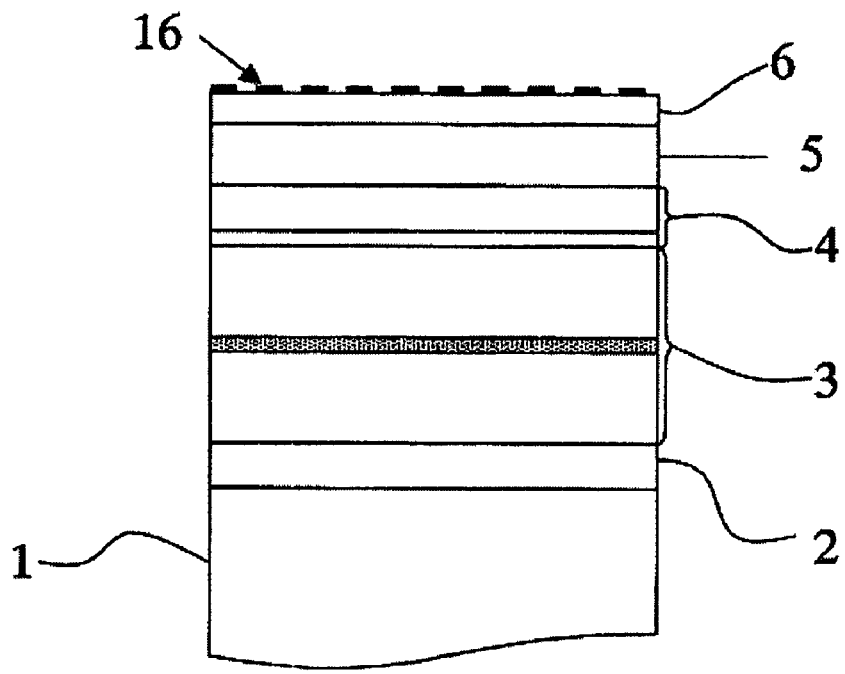
FIG. 7 shows an example for the layer constitution of a magnetic recording medium formed according to the invention.

Then, the protective layer 6 was formed by RF-CVD. The pressure during film formation was set to 2.2 Pa, and hydrogen and nitrogen were added each in a constant amount of 20% and 2% respectively to ethylene, to form a DLC film. The film thickness was controlled to be constant at 5 nm. FIG. 7 shows the layer constitution of a magnetic recording medium prepared by the method described above. A lubrication layer 16 was formed at the outermost surface in FIG. 7.

Figure 3:
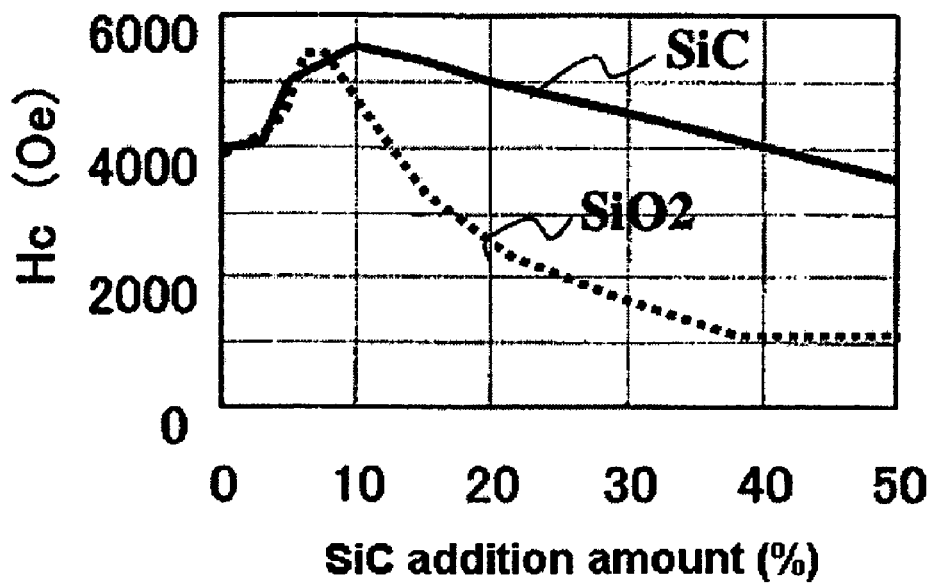
FIG. 3 shows the result of the evaluation for magnetic characteristics of a magnetic recording medium according to the coercive force in Example 1.

FIG. 3 shows the result for the evaluation of the magnetic characteristics according to the coercive force. The abscissa shows the composition of SiC in the target. From the result, it was found that the coercive force (Hc(Oe)) of the magnetic recording medium could be maintained to 4 kOe or more at a composition of SiC of from about 5 to 40 mol %. Further, it was found that a maximum value was attained at the SiC composition of 10 mol %.

Accordingly, it can be said that favorable magnetic characteristics can be provided within a range of the SiC composition of from about 5 to 40 mol %, particularly, at the SiC composition of about 10 mol %. On the other hand, as shown in FIG. 3, in the case of adding $SiO_2$, when the addition amount thereof exceeded 10 mol %, remarkable degradation was observed for the magnetic characteristics. It is considered that since oxygen dissociated upon sputtering of $SiO_2$ caused non-equilibrium reaction to provide an excess oxygen state as described above, when $SiO_2$ is added exceeding a predetermined amount, the main constituent elements such as Co, Cr of the magnetic film are oxidized, resulting in the deterioration of the characteristics.

EXAMPLE 2

As can be seen from Example 1, since the SiC composition showing the maximum coercive force is 10 mol %, the SiC composition was fixed at 10 mol % in this example and the oxygen composition to the Ar during sputtering was optimized.

At first, a glass substrate after cleaning of +65 mm×0.635 mmt, with the surface roughness Ra: 0.320 nm was used for the substrate 1. The glass substrate was placed in the continuous multi-layer sputtering apparatus, an Ni40Ta target was used as the adhesion layer 2, and DC-power of 500 W was charged by a DC magnetron cathode under the condition at an Ar pressure of 1.25 Pa to form a layer of 30 nm thickness.

Then, after forming a film of Co10Ta5Zr to 100 nm as the soft magnetic under layer 3, an Ru film was formed to 1 nm and, further, a Co10Ta5Zr film was formed to 100 nm to form the soft magnetic under layer 3 of an APC structure. The Ar pressure during film formation was made constant at 0.6 Pa in each case. The charged power by the DC magnetron cathode was 2 kw for CoTaZr and 100 w for Ru.

The under layer 4 had a two layer structure of Ta and Ru, the film thickness was made constant to 3 nm for Ta and to 15 nm for Ru, and the Ar pressure upon film formation was set at 1 Pa and 4 Pa for Ta and Ru, respectively.

A DC magnetron cathode was used upon film formation of the magnetic layer 5, the film formation pressure was set to 4.2 Pa and the film formation time was changed and controlled at a constant DC charged power of 500 W such that the film thickness was set constant to 15 nm. The target used was 90 mol % (67 at % Co15 at % Cr18 at % Pt)+10 mol % SiC target. The charged power was controlled to be constant at 500 W and the film formation time was controlled based on the film formation speed so as to provide a 15 nm film thickness respectively. Oxygen gas used for sputtering in addition to Ar and changed within a range of 0 to 5% based on Ar.

Figure 4:
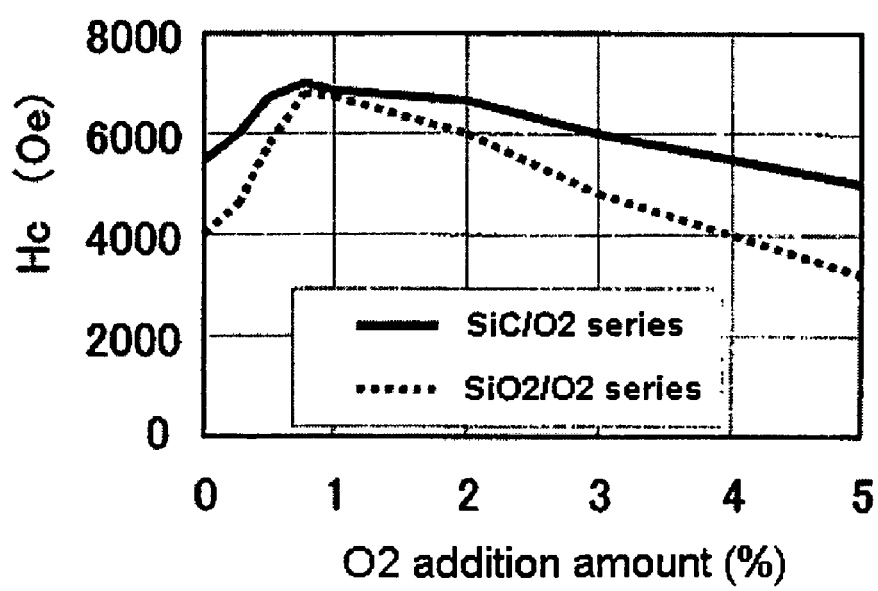
FIG. 4 shows the result of the evaluation for magnetic characteristics of a magnetic recording medium according to the coercive force in Example 2.

Then, the protective layer 6 was formed by RF-CVD. The pressure during film formation was set to 2.2 Pa, and hydrogen and nitrogen were added each in a constant amount of 20% and 2% respectively to ethylene, to form a DLC film. The film thickness was controlled to be constant at 5 nm. FIG. 4 shows the result for the evaluation of the coercive force of the magnetic characteristics of the magnetic recording medium prepared by the method described above.

As shown in FIG. 4, it was found that the coercive force (Hc(Oe)) of the magnetic recording media relative to the addition amount of oxygen showed 5 kOe or more at an oxygen composition of from 0.25% to 4%. Further, it was found that the maximum coercive force was within a range of the oxygen composition of from about 0.75 to 2%.

As shown in FIG. 4, in the case of $SiO_2$, Hc tends to increase in accordance with the increase of the oxygen addition amount in the same manner as in SiC but the characteristics were degraded rapidly after exceeding the maximum value. This is because the non-equilibrium reaction with excessive oxygen is promoted in the case where the amount of oxygen exceeds a predetermined amount to develop remarkable degradation of the magnetic characteristics, as shown in Example 1.

EXAMPLE 3

Figure 5:
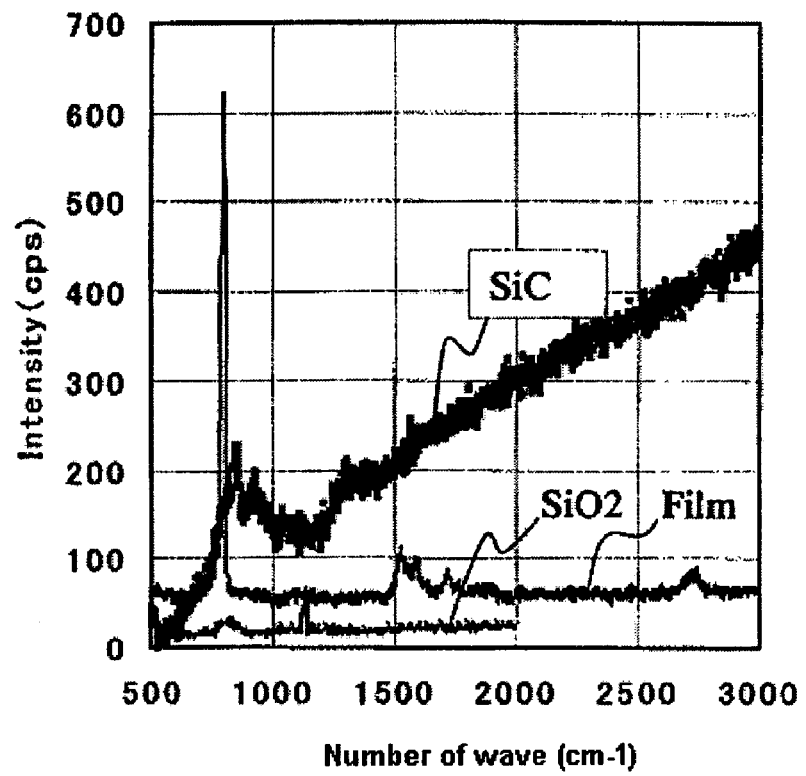
FIG. 5 shows the result of Raman spectroscopy of a magnetic film of a sample prepared in Example 3.

In this example, for a magnetic recording medium of particularly high coercive force with Hc of about 7.0 kOe at an oxygen composition of about 1.5%, among the magnetic recording media prepared in Example 2, the adhesion layer 2 to magnetic layer 5 were formed under the identical conditions to prepare samples. The protective layer 6 was not formed. When the bonding state concerning Si in the magnetic layer 5 of the sample was analyzed by using Raman spectroscopy as follows. Peaks attributable to SiC, $SiO_x$ (X=1 to 2) bonds as shown in FIG. 5 and it has been found that those having SiC and $SiO_x$ bonds are included. That is, in the waveform of $SiO_2$ (bulk) shown in FIG. 5, a broad peak was observed near 800 $cm^{-1}$ due to the symmetric stretching of O—Si—O, and a peak was observed near 1150 $cm^{-1}$ being attributable to Si—O stretching. On the contrary, in the Raman spectrum for SiC (bulk), a typical sharp SiC peak was observed at 800 $cm^{-1}$, and broad peaks including a double wave attributable to a-SiC were observed between 1510 $cm^{-1}$ to 1700 $cm^{-1}$. In the spectrum of a sample (film) of Example 3 formed from SiC with $Ar+O_2$ based thereon, a peak attributable to Si—OH stretching was observed near 850 $cm^{-1}$, an $SiH_2$ deviation angle was observed near 928 $cm^1$, a small peak attributable to a-SiC was observed near 1580 $cm^{-1}$, and a peak considered to be attributable to Si—H stretching was observed near 2340 $cm^{-1}$.

Figure 8:
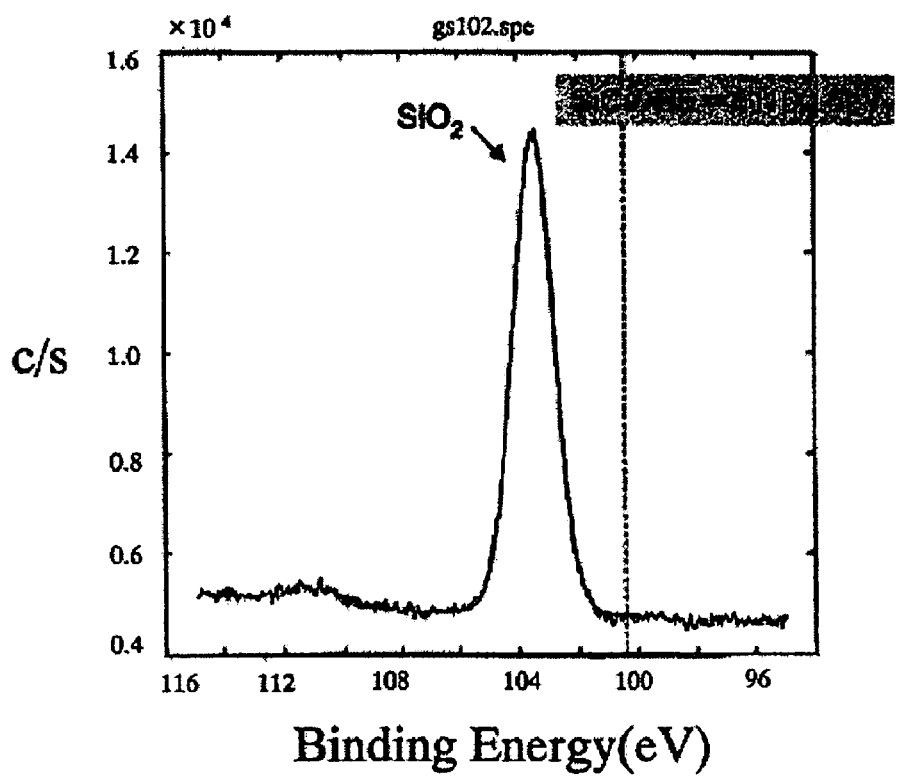
FIG. 8(a) shows a profile of $SiO_2$ according ESCA analysis for the magnetic film of a sample prepared in Example 3.
FIG. 8(b) shows a profile of SiC according ESCA analysis for the magnetic film of a sample prepared in Example 3.
Figure 8:
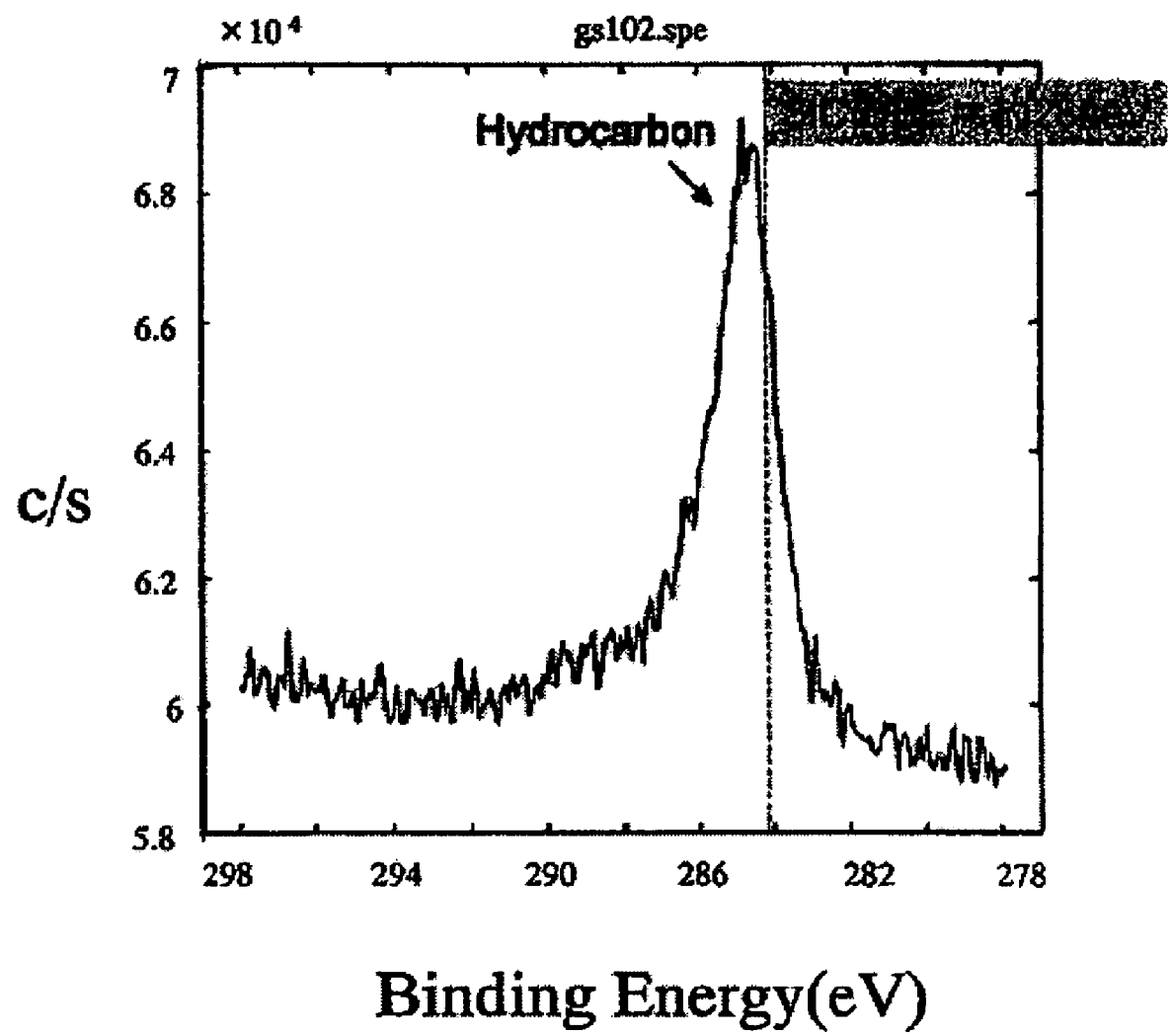

FIG. 8 shows the result of conducting ESCA (X-ray photoelectronic spectroscopy) analysis for an identical sample in association with the Raman spectroscopy. FIG. 8(a) shows an $SiO_2$ profile according to ESCA analysis in the magnetic film of this example and FIG. 8(b) shows an SiC profile by ESCA analysis in the magnetic layer of this example respectively. As the ESCA spectrum attributable to SiO and SiC obtained in Raman spectrum, a spectrum attributable to the $SiO_2$ bond was observed as a single peak near 103.5 eV in FIG. 8(a). Further, as shown in FIG. 8(b), composite peaks attributable to CH, SiC were observed at 284 to 185 eV. Also from the result, it is apparent that both of SiO and SiC bonds are present. It is considered that peaks attributable to CH are present in both of the Raman spectroscopy and ESCA analysis because $H_2O$ in the atmospheric air and C radicals are reacted due to sampling with no protective film.

From the foregoing, it has become clear that peaks attributable to SiO and SiC are present in the film in the sample of Example 3. According to the result, the presence of such compounds is one of the factors for the improvement of the magnetic characteristics of the magnetic recording medium practiced in this invention.

In the analyses described above, the Raman spectroscopy was measured by using a microscopic Raman spectroscopic device manufactured by Raineyshow Co. The analyses were performed within range of the wave number of from 500 to 3000 cm$^{-1}$, using an He—Ne laser at 6328 Å as a laser and for the accumulation time of 200 sec.

EXAMPLE 4

For a method of confirming the stability and the repeatability which are of primary concern in the invention, since it is necessary to continuously form films of more magnetic recording media under identical conditions and confirm the magnetic characteristics. Accordingly, continuous film formation of as many as 50,000 sheets were conducted under the conditions of the oxygen addition composition of about 1.5% providing favorable magnetic characteristics among the film formation conditions for the magnetic film 5 conducted in Example 2, and the stability and the repeatability were evaluated according to the magnetic characteristics.

In the film formation, a glass substrate after cleaning of +65 mm×0.635 mmt, with the surface roughness Ra: 0.320 nm was used for the substrate 1. The glass substrate was placed in the continuous multi-layer sputtering apparatus, an Ni40Ta target was used as the adhesion layer 2, and DC-power of 500 W was charged by a DC magnetron cathode under the condition at an Ar pressure of 1.25 Pa to form a layer of 30 nm thickness.

Then, after forming a film of Co10Ta5Zr to 100 nm as the soft magnetic under layer 3, an Ru film was formed to 1 nm and, further, a Co10Ta5Zr film was formed to 100 nm to form the soft magnetic under layer 3 of an APC structure. The Ar pressure during film formation was made constant at 0.6 Pa in each case. The charged power by the DC magnetron cathode was 2 kw for CoTaZr and 100 w for Ru.

The under layer 4 had a two layer structure of Ta and Ru, the film thickness was made constant to 3 nm for Ta and to 15 nm for Ru, and the Ar pressure upon film formation was set at 1 Pa and 4 Pa, respectively.

A DC magnetron cathode was used upon film formation of the magnetic layer 5, the film formation pressure was set to 4.2 Pa, and the film formation time was changed and controlled at a constant DC charged power of 500 W such that the film thickness was set constant to 15 nm. The target used was 90 mol % (67 at % Co15 at % Cr18 at % Pt)+10 mol % SiC target. The charged power was controlled to be constant at 500 W and the film formation time was controlled based on the film formation speed so as to provide a 15 nm film thickness respectively. Oxygen gas was added for use in sputtering in addition to Ar at a ratio of about 1.5% based on Ar.

Then, the protective layer 6 was formed by RF-CVD. The pressure during film formation was set to 2.2 Pa, and hydrogen and nitrogen were added each in a constant amount of 20% and 2% respectively to ethylene, to form a DLC film. The film thickness was controlled to be constant at 5 mm.

Figure 6:
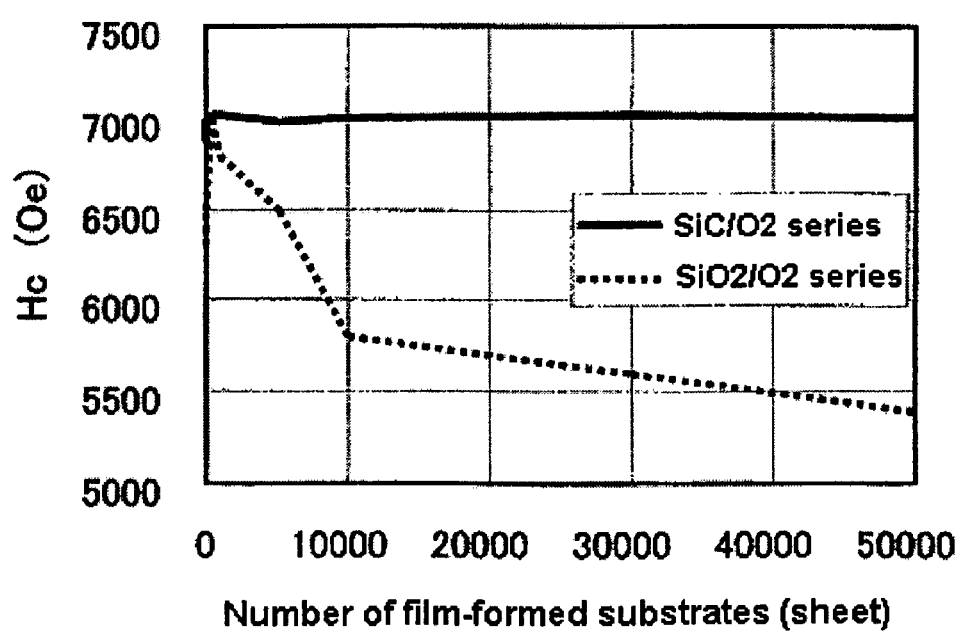
FIG. 6 shows the aging change of magnetic characteristics during continuous film formation for 50,000 sheets of magnetic recording media in Example 4.

Evaluation was made according to a relation between the number of substrates and the coercive force Hc. FIG. 6 shows the result. As shown in FIG. 6, it has been found that the coercive force Hc(Oe) as the magnetic characteristics was about 7 kOe when the oxygen composition to Ar was about 1.5% at the SiC composition of 10 mol % in the film formation of the CoCrPt series magnetic film with addition of SiC in this example, and no lower or remarkable change of the coercive force was not observed even during continuous film formation for 50,000 sheets compared with the existent SiO$_2$ addition system, and that the magnetic recording media of extremely stable reproducibility can be formed. From the result, it can be confirmed that the non-equilibrium state caused in the existent SiO$_2$ addition system reactive sputtering can be eliminated by adopting this system and the reactive sputtering can be conducted in the equilibrium state.

It is to be understood that the above description is intended to be illustrative and not restrictive. Many embodiments will be apparent to those of skill in the art upon reviewing the above description. The scope of the invention should, therefore, be determined not with reference to the above description, but instead should be determined with reference to the appended claims alone with their full scope of equivalents.

What is claimed is:

1. A method of manufacturing a magnetic recording medium comprising:
    forming a film of an adhesion layer by sputtering on a substrate;
    forming a film of a soft magnetic under layer by sputtering on the adhesion layer;
    forming a film of a magnetic layer by reactive sputtering on the under layer; and
    forming a film of a protective layer by an RF-CVD method on the magnetic layer;
    wherein an Ar gas and an oxygen gas are added to an SiC-containing target in forming the film of the magnetic layer.

2. A method of manufacturing a magnetic recording medium according to claim 1, wherein the substrate has a center line mean roughness of about 0.3 nm or less and a maximum protrusion height of about 5 nm or less.

3. A method of manufacturing a magnetic recording medium according to claim 1, wherein the soft magnetic under layer has a saturated magnetic flux density in the range of about 0.8 T to 3.0 T.

4. A method of manufacturing a magnetic recording medium according to claim 1, wherein the soft magnetic under layer has a film thickness in the range of about 50 nm to 300 nm.

5. A method of manufacturing a magnetic recording medium according to claim 1, wherein the under layer has a film thickness in the range of about 5 nm to 20 nm.

6. A method of manufacturing a magnetic recording medium according to claim 1, wherein the magnetic layer is a granular layer.

7. A method of manufacturing a magnetic recording medium according to claim 1, wherein the composition of SiC in the target is in the range of about 5 mol % to 40 mol %.

8. A method of manufacturing a magnetic recording medium according to claim 7, wherein the composition of SiC in the target is about 10 mol %.

9. A method of manufacturing a magnetic recording medium according to claim 1, wherein SiC is electroconductive.

10. A method of manufacturing a magnetic recording medium according to claim 1, wherein the target has CoCrPt.

11. A method of manufacturing a magnetic recording medium according to claim 1, wherein the gas composition of the oxygen gas to the Ar gas is in the range of about 0.75% to 2%.

12. A method of manufacturing a magnetic recording medium according to claim 1, wherein the gas composition of the oxygen gas to the Ar gas is about 1.5%.

* * * * *